United States Patent [19]

Matsui et al.

[11] Patent Number: 5,699,316

[45] Date of Patent: Dec. 16, 1997

[54] SEMICONDUCTOR MEMORY DEVICE

[75] Inventors: Katsuaki Matsui; Tamihiro Ishimura; Sampei Miyamoto, all of Tokyo, Japan

[73] Assignee: Oki Electric Industry Co., Ltd., Tokyo, Japan

[21] Appl. No.: 542,221

[22] Filed: Oct. 12, 1995

[30] Foreign Application Priority Data

Dec. 15, 1994 [JP] Japan .................... 6-311806

[51] Int. Cl.$^6$ .................. G11C 11/34; H01L 27/10
[52] U.S. Cl. .................. 365/230.05; 365/230.01; 365/230.06; 365/189.03
[58] Field of Search .............. 365/230.01, 230.03, 365/230.05, 230.06, 189.01, 189.03

[56] References Cited

U.S. PATENT DOCUMENTS 5,177,706  1/1993  Shinohara et al. .......... 365/189.04
5,455,798  10/1995  McClure ................... 365/200

Primary Examiner—Viet Q. Nguyen

[57] ABSTRACT

A semiconductor memory device according to the present invention comprise a plurality of arrays each supplied with a common column address signal. In an selected array, the potential of a data line is set to a potential corresponding to a potential supplied to a corresponding bit line in response to the potential of the bit line, the potential of the corresponding column address signal and the potential of a terminal. In non-selected array other than the selected array at this time, since the potential of a terminal in the non-selected array is set to a potential different from that of the terminal in the selected array, the potential of the data line remains unchanged irrespective of the column address signal.

3 Claims, 9 Drawing Sheets

SEMICONDUCTOR MEMORY DEVICE

BACKGROUND OF THE INVENTION

1. Field of the Invention

The present invention relates to a semiconductor memory devices.

2. Description of the Related Art

In the conventional semiconductor memory device, a plurality of memory cells arranged in matrix form are divided into a plurality of blocks (hereinafter called "arrays"). In this type of semiconductor memory device, various operations such as a data reading operation, etc. are carried out in array units.

The conventional semiconductor memory device has output circuits each of which supplies data corresponding to data supplied from a memory cell to its corresponding bit line to a data line in response to a column address signal sent to one of the column address lines. The output circuit comprises two transistors series-connected between a terminal supplied with a ground potential and the data line. A control electrode of one of the two transistors is electrically connected to its corresponding bit line. A control electrode of the other thereof is electrically connected to its corresponding column address line.

When data stored in a memory cell, which has been supplied to a bit line, is a "1", for example, a transistor connected to the bit line is turned ON and a transistor supplied with a column address signal is turned ON in response to the column address signal. Thus, the data line is reduced in potential. As a result, data corresponding to the data "1" supplied to the bit line, is supplied to the data line. On the other hand, when the data referred to above is a "0", the transistor connected to the bit line is turned OFF. Thus, the potential of the data line is maintained as it is. As a result, data corresponding to the data "0" of the memory cell, which has been supplied to the bit line, is sent to the data line.

According to the conventional semiconductor memory device as described above, the above operations are performed by the selected array alone. It is therefore possible to reduce power consumption of the whole semiconductor memory device.

SUMMARY OF THE INVENTION

An object of the present invention is to provide a semiconductor memory device which provides less power consumption. The semiconductor memory device according to the present invention comprises a plurality of arrays and a decoder which selects some or any one of the arrays. The each array includes a row address line, a memory cell connected to the row address line, a bit line being supplied with data stored in the memory cell when the row address line is selected, a data line, a column address line being inputted with a column address signal, a terminal, and an output circuit connected to the data line, the terminal, the column address line and the bit line and having a first state for setting a preset potential of the data line to a potential corresponding to a potential of the bit line and a second state for holding the preset potential of the data line constant.

The column address lines of the plurality of arrays are mutually connected to one another. In the semiconductor memory device, the output circuit of the array selected by the decoder is set to the first state and the output circuit of non-selected array is maintained at the second state.

Another object of the present invention is to provide a semiconductor memory device which provide a higher operating speed. In order to achieve the above object, the semiconductor memory device is provided with a data line potential setting circuits connected to a data line at plural places thereof so as to correspond to first and second output circuits connected between the data line and a data transfer enable line and adapted to supply a potential to the data line or provided with a potential setting circuits connected to the data transfer enable line at plural places thereof and adapted to supply a potential to the data transfer enable line.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 2:
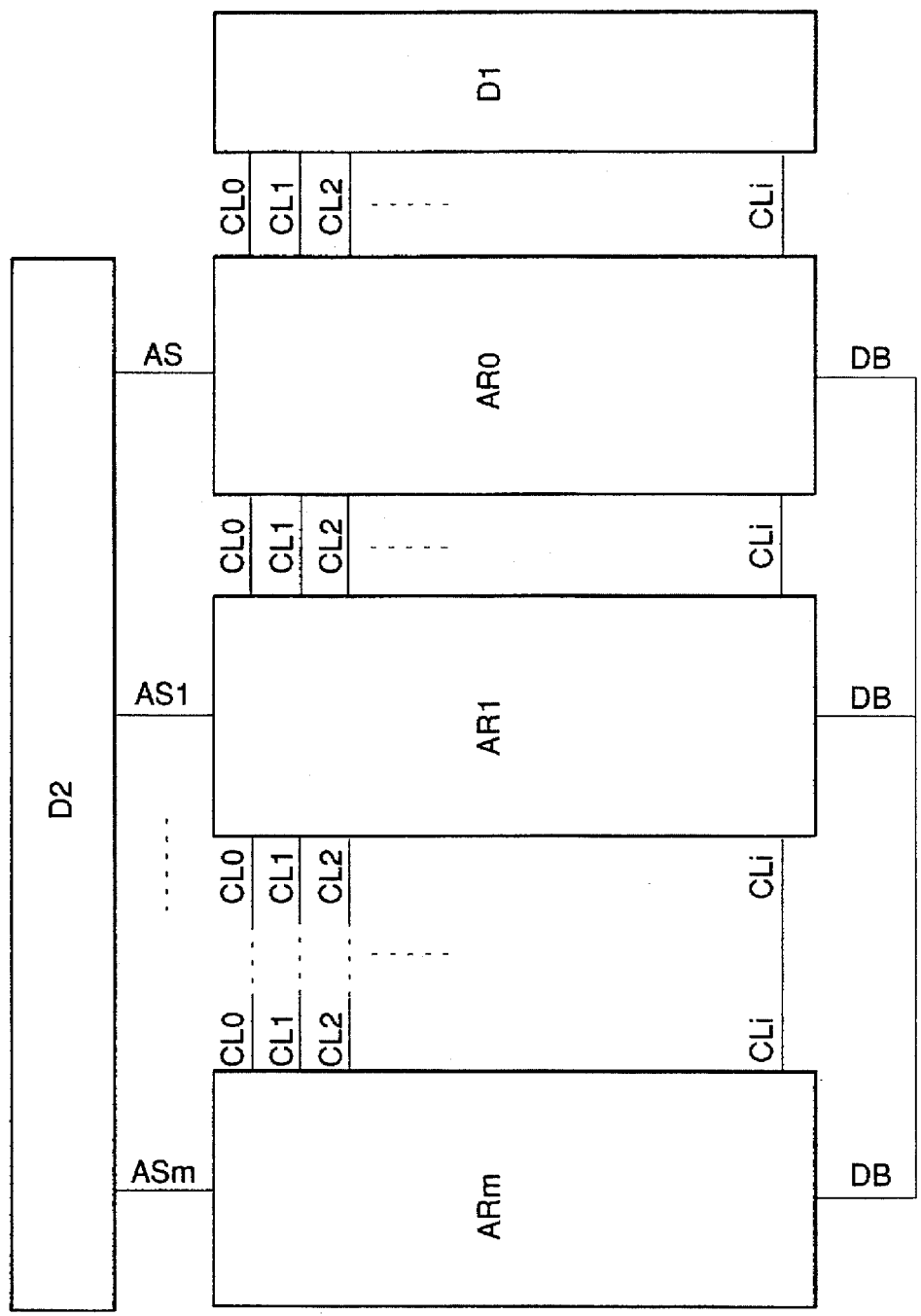
FIG. 2 is a view schematically illustrating a configuration of a semiconductor memory device according to the present invention.

FIG. 2 is a view schematically showing a configuration of a semiconductor memory device according to a first embodiment of the present invention.

The semiconductor memory device comprises a plurality of arrays $AR_0$ through $AR_m$ and decoder circuits D1 and D2.

Column address lines $CL_0$, ~, $CL_i$ are respectively connected to the decoder circuit D1 and the arrays $AR_0$ through $AR_m$. The decoder circuit D1 serves as a circuit for selecting a desired column address line from the column address lines $CL_0$, ~, $CL_i$.

Each of array selection signal lines $AS_0$, ~, $AS_m$ are electrically connected to the decoder circuit D2, and each of array selection signal lines are electrically connected to are corresponding array of the arrays $AR_0$ through $AR_m$. The decoder circuit D2 serves as a circuit for selecting a desired array selection signal line from the array selection signal lines $AS_0$, ~, $AS_m$ so as to select a desired array.

A plurality of data lines DB are electrically connected to their corresponding arrays $AR_0$, ~, $AR_m$.

Figure 3:
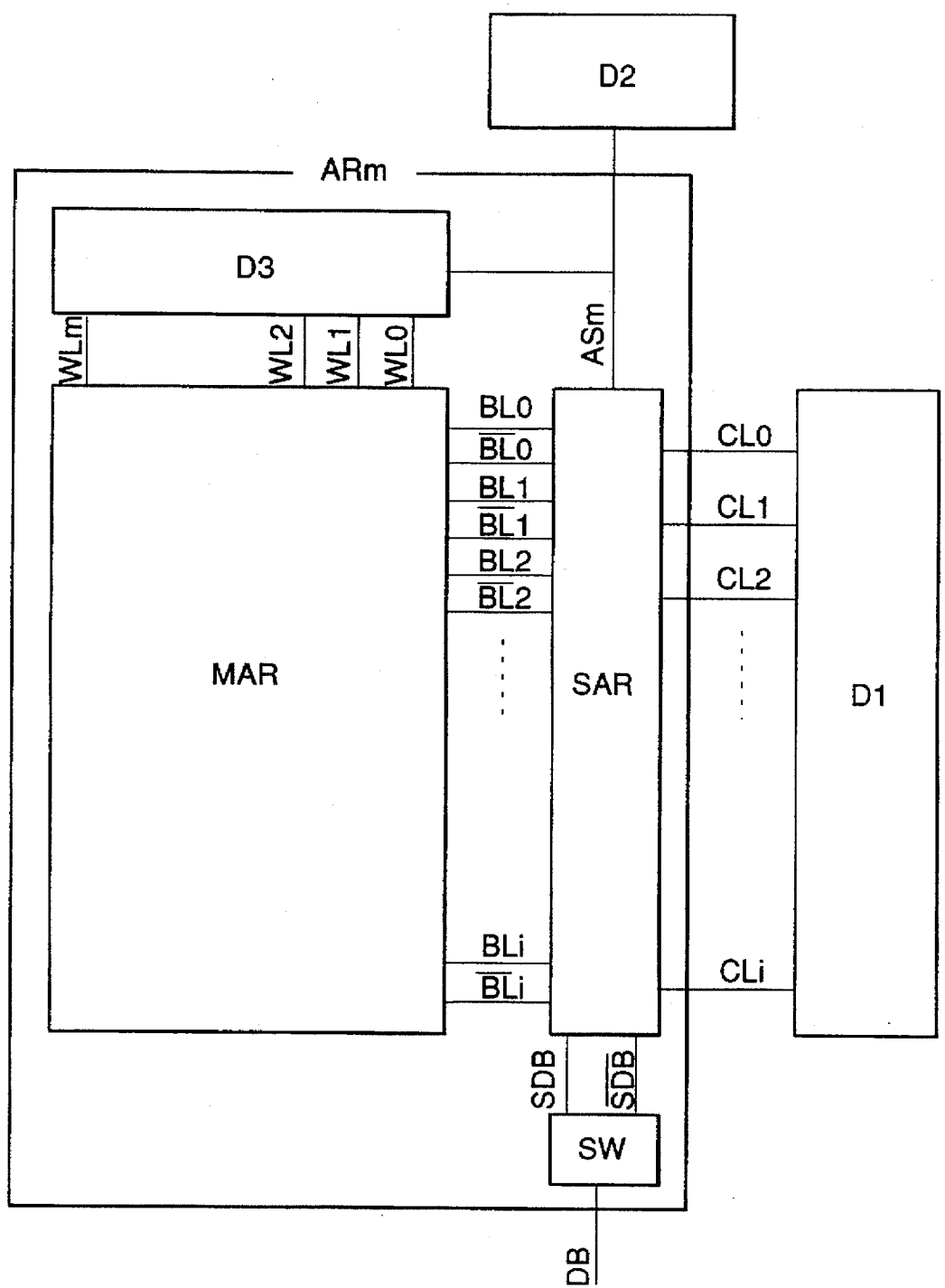
FIG. 3 is a view schematically depicting a configuration of an array $AR_m$.

FIG. 3 is a view schematically showing a configuration of the array $AR_m$. The $AR_m$ will be described below with reference to FIG. 3.

The array $AR_m$ comprises a decoder circuit D3, a memory cell array MAR having a plurality of memory cells arranged in matrix form, a sense amplifier array SAR composed of a plurality of sense amplifiers and a sense amplifier control circuit, and a switching circuit SW electrically connected between the sense amplifier array SAR and a data line DB.

The decoder circuit D3 is electrically connected to the memory cell array MAR through a plurality of row address lines $WL_0$, ~, $WL_m$. The decoder circuit D3 is electrically connected to the decoder circuit D2 through the array selection signal line $AS_m$. Further, the decoder circuit D3 serves as a circuit for selecting a row address line corresponding to an input row address when the array selection signal line $AS_m$ is selected.

The memory cell array MAR is electrically connected to the sense amplifier array SAR through a plurality of bit lines $BL_0$, ~, $\overline{BL_i}$. A brief description will now be made of a circuit operation of the memory cell array MAR. When the decoder circuit D3 selects one row address line, a plurality of data stored in a plurality of memory cells connected to the selected row address line are supplied to their corresponding bit lines. Since the individual bit lines are electrically connected to the sense amplifier array SAR, the data stored in the respective memory cells connected to the selected row address line are transferred to the sense amplifier array SAR.

The sense amplifier array SAR is electrically connected to the decoder circuit D1 through the column address lines $CL_0$, ~, $CL_i$. Further, the sense amplifier array SAR is electrically connected to the decoder circuit D2 through the array selection signal line $AS_m$. Furthermore, the sense amplifier array SAR is electrically connected to the switching circuit SW through data lines SDB and $\overline{SDB}$. The sense amplifier array SAR comprises a plurality of sense amplifiers composed of sense latch circuits and output circuits and connected to their corresponding bit line pairs, and a sense amplifier control circuit. Each of the sense latch circuits amplifies data stored in a memory cell, which has been supplied to its corresponding bit line. Each of the output circuits outputs data corresponding data stored in a memory cell, which has been supplied to a bit line corresponding to a column address line selected by the decoder circuit D1, to the data lines SDB and $\overline{SDB}$.

The switching circuit SW is electrically connected to the sense amplifier array SAR through the data lines SDB and $\overline{SDB}$. The switching circuit SW controls the transfer of data corresponding to the data sent to the data lines SDB or $\overline{SDB}$ to the data line DB.

The sense amplifier array SAR and the decoder D3 included in each of the arrays $AR_0$ through $AR_m$ are electrically connected to their corresponding array selection signal line of the array selection signal lines $AS_0$ through $AS_m$. Since inner circuit configurations of the respective arrays $AR_0$ through $AR_m$ are substantially identical to one another, the arrays other than the array $AR_m$ which has been described above, will not be described.

Figure 1:
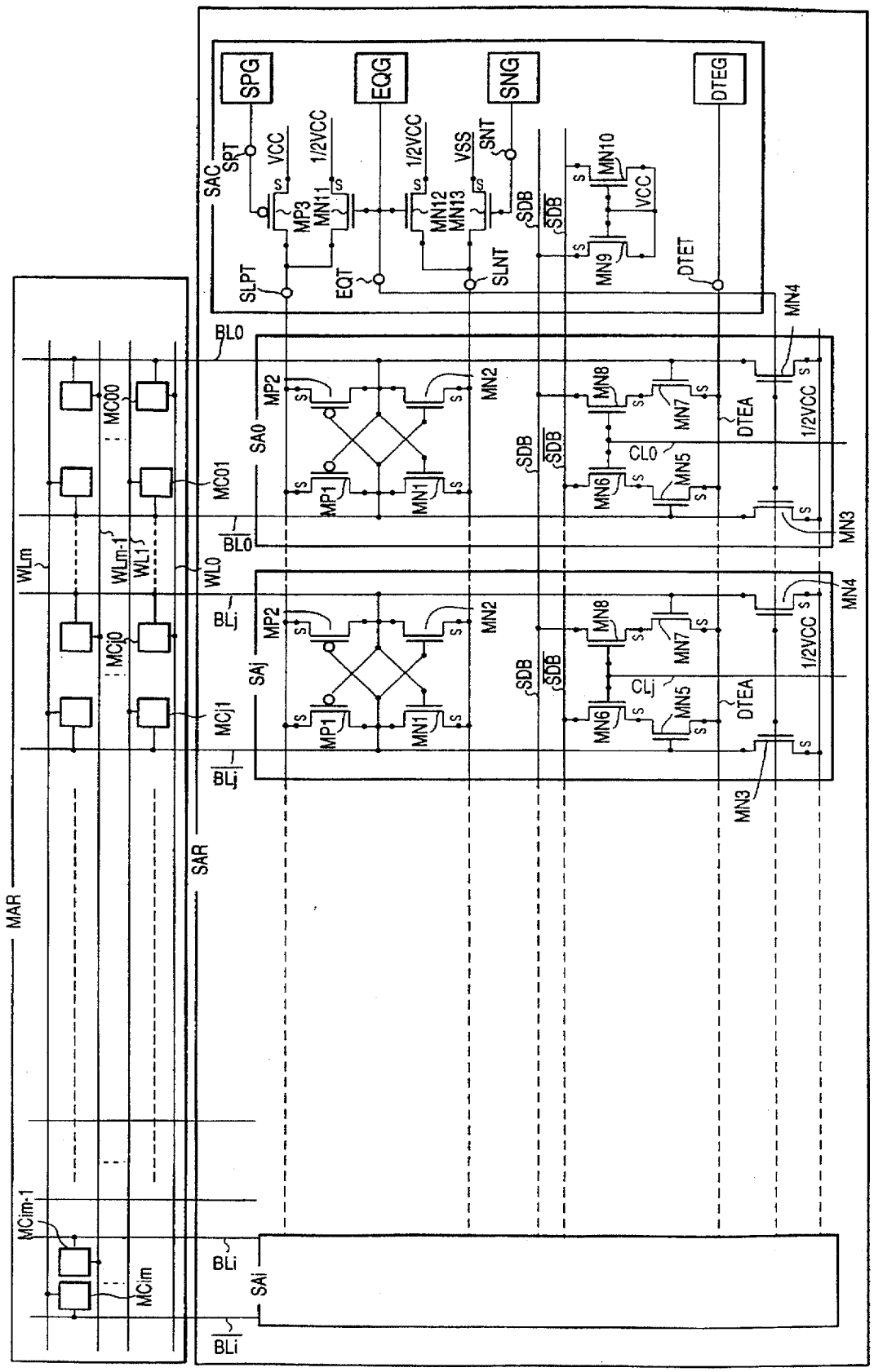
FIG. 1 is a fragmentary circuit diagram showing a sense amplifier array employed in a first embodiment of the present invention.

FIG. 1 is a fragmentary circuit diagram showing a sense amplifier array employed in the first embodiment of the present invention. The first embodiment will be described below with reference to FIG. 1.

FIG. 1 is a fragmentary circuit diagram of a sense amplifier array SAR which comprises a plurality of sense amplifiers $SA_0$, ~, $SA_i$ and a sense amplifier control circuit SAC. Incidentally, a memory cell array MAR is also described to provide easy understanding of the relationship of correspondence between memory cells and sense amplifiers.

The memory cell array MAR includes a plurality of memory cells $MC_{00}$ through $MC_{im-1}$ electrically connected to their corresponding bit lines of bit lines $BL_0$, ~, $BL_j$, ~, $BL_i$ provided on an alternate basis counting from the bit line $BL_0$ and electrically connected to their corresponding row address lines of row address lines $WL_0$, $WL_2$, ~, $WL_{m-1}$ provided on an alternate basis counting from the row address line $WL_0$. Further, the memory cell array MAR includes a plurality of memory cells $MC_{01}$, ~, $MC_{im}$ electrically connected to their corresponding bit lines of bit lines $\overline{BL_0}$, ~, $\overline{BL_j}$, ~, $\overline{BL_i}$ provided on an alternate basis counting from the bit line $\overline{BL_0}$ and electrically connected to their corresponding row address lines of row address, lines $WL_1$, $WL_3$, ~, $WL_m$ provided on an alternate basis counting from the row address line $WL_1$.

The bit line pair ($BL_0$ and $\overline{BL_0}$) is electrically connected to its corresponding sense amplifier $SA_0$. Similarly, the bit lines of the bit line pairs ($BL_1$ and $\overline{BL_1}$) ~($BL_i$ and $\overline{BL_i}$) are electrically connected to their corresponding sense amplifiers $SA_1$, ~, $SA_i$. The sense amplifiers $SA_0$ through $SA_i$ are electrically connected to their corresponding column address lines $CL_0$, ~, $CL_i$.

The sense amplifier $SA_j$ will now be described.

The sense amplifier $SA_j$ comprises a sense latch circuit and an output circuit. The sense latch circuit comprises N-channel type Metal Oxide Semiconductor transistors (hereinafter called "NMOS transistors") $MN_1$ and $MN_2$ used for detection and amplification, P-channel type MOS transistors (hereinafter called "PMOS transistors") $MP_1$ and $MP_2$, and NMOS transistors $MN_3$ and $MN_4$ used for equalization of bit lines. The source of the NMOS transistor $MN_1$ is electrically connected to a sense latch terminal SLNT. The drain of the NMOS transistor $MN_1$ is electrically connected to the bit line $\overline{BL_j}$ and the gate thereof is electrically connected to the bit line $BL_j$. The source of the NMOS transistor $MN_2$ is electrically connected to the sense latch terminal SLNT. The drain of the NMOS transistor $MN_2$ is electrically connected to the bit line $BL_j$ and the gate thereof is electrically connected to the bit line $\overline{BL_j}$. The source of the PMOS transistor $MP_1$ is electrically connected to a sense latch terminal SLPT. The drain of the PMOS transistor $MP_1$ is electrically connected to the bit line $\overline{BL_j}$ and the gate thereof is electrically connected to the bit line $BL_j$. The source of the PMOS transistor $MP_2$ is electrically connected to the sense latch terminal SLPT. The drain of the PMOS transistor $MP_2$ is electrically connected to the bit line $BL_j$ and the gate thereof is electrically connected to the bit line $\overline{BL_j}$. The source of the NMOS transistor $MN_3$ is supplied with a potential of $\frac{1}{2}V_{CC}$. The drain of the NMOS transistor $MN_3$ is electrically connected to the bit line $\overline{BL_j}$ and the gate thereof is electrically connected to a sense latch circuit equalize EQT. The source of the NMOS transistor $MN_4$ is supplied with the potential of $\frac{1}{2}V_{CC}$. The drain of the NMOS transistor $MN_4$ is electrically connected to the bit line $BL_j$ and the gate thereof is electrically connected to the sense latch circuit equalize terminal EQT.

The output circuit comprises N-channel type MOS transistors $MN_5$, $MN_6$, $MN_7$ and $MN_8$. The NMOS transistors $NM_5$ and $MN_6$ are series-connected between a data line $\overline{SDB}$ and a date transfer enable line DTEA. Further, the NMOS transistors $MN_7$ and $MN_8$ are series-connected between a data line SDB and the data transfer enable line DTEA. The column address line $CL_j$ is electrically connected to the gate of the NMOS transistor $MN_6$ and the gate of the NMOS transistor $MN_8$. The gate of the NMOS transistor $MN_5$ is electrically connected to the bit line $\overline{BL_j}$ and the gate of the NMOS transistor $MN_7$ is electrically connected to the bit line $BL_j$.

Each of the sense amplifiers $SA_0$, ~, $SA_i$ electrically connected to their corresponding bit lines of the bit line pairs $(BL_0$ and $\overline{BL_0})$~$(BL_i$ and $\overline{BL_i})$ is composed of NMOS transistors $MN_1$, $MN_2$, $MN_3$, $MN_4$, $MN_5$, $MN_6$, $MN_7$ and $MN_8$ and PMOS transistors $MP_1$ and $MP_2$ in a manner similar to the sense amplifier $SA_j$. The drain of the transistor $MN_1$ of each of the sense amplifiers $SA_0$, ~, $SA_i$ is electrically connected to its corresponding bit line of the bit lines $\overline{BL_0}$, ~, $\overline{BL_i}$. The gate of the transistor $MN_1$ of each of the sense amplifiers $SA_0$, ~, $SA_i$ is electrically connected to its corresponding bit line of the bit lines $BL_0$, ~, $BL_i$. The drain of the transistor $MN_2$ of each of the sense amplifiers $SA_0$, ~, $SA_i$ is electrically connected to its corresponding bit line of the bit lines $BL_0$, ~, $BL_i$. The gate of the transistor $MN_2$ of each of the sense amplifiers $SA_0$, ~, $SA_i$ is electrically connected to its corresponding bit line of the bit lines ($\overline{BL_0}$, ~, $\overline{BL_i}$). The drain of the transistor $MP_1$ of each of the sense amplifiers $SA_0$, ~, $SA_i$ is electrically connected to its corresponding bit line of the bit lines $\overline{BL_0}$, ~, $\overline{BL_i}$. The gate of the transistor $MP_1$ of each of the sense amplifiers $SA_0$, ~, $SA_i$ is electrically connected to its corresponding bit line of the bit lines $BL_0$, ~, $BL_i$. The drain of the transistor $MP_2$ of each of the sense amplifiers $SA_0$, ~, $SA_i$ is electrically connected to its corresponding bit line of the bit lines $BL_0$, ~, $BL_i$. The gate of the transistor $MP_2$ of each of the sense amplifiers $SA_0$, ~, $SA_i$ is electrically connected to its corresponding bit line of the bit lines $\overline{BL_0}$, ~, $\overline{BL_i}$. The gate of the transistor $MN_5$ of each of the sense amplifiers $SA_0$, ~, $SA_i$ is electrically connected to its corresponding bit line of the bit lines $\overline{BL_0}$, ~, $\overline{BL_i}$. The gate of the transistor $MN_7$ of each of the sense amplifiers $SA_0$, ~, $SA_i$ is electrically connected to its corresponding bit line of the bit lines $BL_0$, ~, $BL_i$. The drain of the transistor $MN_3$ of each of the sense amplifiers $SA_0$, ~, $SA_i$ is electrically connected to its corresponding bit line of the bit lines $\overline{BL_0}$, ~, $\overline{BL_i}$. The drain of the transistor $MN_4$ of each of the sense amplifiers $SA_0$, ~, $SA_i$ is electrically connected to its corresponding bit line of the bit lines $BL_0$, ~, $BL_i$. The gate of the transistor $MN_6$ of each of the sense amplifiers $SA_0$, ~, $SA_i$ is electrically connected to its corresponding column address line of the column address lines $CL_0$, ~, $CL_i$. The gate of the transistor $MN_8$ of each of the sense amplifiers $SA_0$, ~, $SA_i$ is electrically connected to its corresponding column address line of the column address lines $CL_0$, ~, $CL_i$. Since electrical connections of the individual sense amplifiers $SA_0$, ~, $SA_i$, which are other than the electrical connections referred to above, are similar to those made by the sense amplifier $SA_j$, their description will be omitted.

A sense amplifier control circuit SAC will now be described.

The sense amplifier control circuit SAC comprises NMOS transistors $MN_9$, $MN_{10}$, $MN_{11}$, $MN_{12}$, $MN_{13}$, a PMOS transistor $MP_3$ and generating circuits SPG, EQG, SNG and DTEG.

The drain and gate of the NMOS transistor $MN_9$ are supplied with a power source potential $V_{CC}$. The source of the NMOS transistor $MN_9$ is electrically connected to the data line SDB. The drain and gate of the NMOS transistor $MN_{10}$ are supplied with the power source potential $V_{CC}$. The source of the NMOS transistor $NM_{10}$ is electrically connected to the data line $\overline{SDB}$.

The generating circuit DTEG is of a circuit for supplying a data transfer enable signal DTE to a data transfer enable terminal DTET to which the data transfer enable line DTEA is connected. The generating circuit SNG is of a circuit for supplying an N-channel sense latch enable signal SN to an N-channel sense latch enable terminal SNT. The generating circuit EQG is of a circuit for supplying a sense latch circuit equalizing signal EQ to the sense latch circuit equalize terminal EQT. The generating circuit SPG is of a circuit for supplying a P-channel sense latch enable signal SP to a P-channel sense latch activation or enable terminal SPT. The source of the PMOS transistor $MP_3$ is supplied with the power source potential $V_{CC}$. The drain of the PMOS transistor $MP_3$ is electrically connected to the sense latch terminal SLPT. The gate of the PMOS transistor $MP_3$ is electrically connected to the P-channel sense latch enable terminal SPT. The source of the NMOS transistor $MN_{11}$ is supplied with the potential of $½V_{CC}$. The drain of the NMOS transistor $NM_{11}$ is electrically connected to the sense latch terminal SLPT. The gate of the NMOS transistor $NM_{11}$ is electrically connected to the sense latch circuit equalize terminal EQT. The source of the NMOS transistor $MN_{12}$ is supplied with the potential of $½V_{CC}$. The drain of the NMOS transistor $MN_{12}$ is electrically connected to the sense latch terminal SLNT. The gate of the NMOS transistor $MN_{12}$ is electrically connected to the sense latch circuit equalize terminal EQT. The source of the NMOS transistor $MN_{13}$ is supplied with a ground potential $V_{SS}$. The drain of the NMOS transistor $MN_{13}$ is electrically connected to the sense latch terminal SLNT. The gate of the NMOS transistor $MN_{13}$ is electrically connected to the N-channel sense latch enable terminal SNT.

Figure 8:
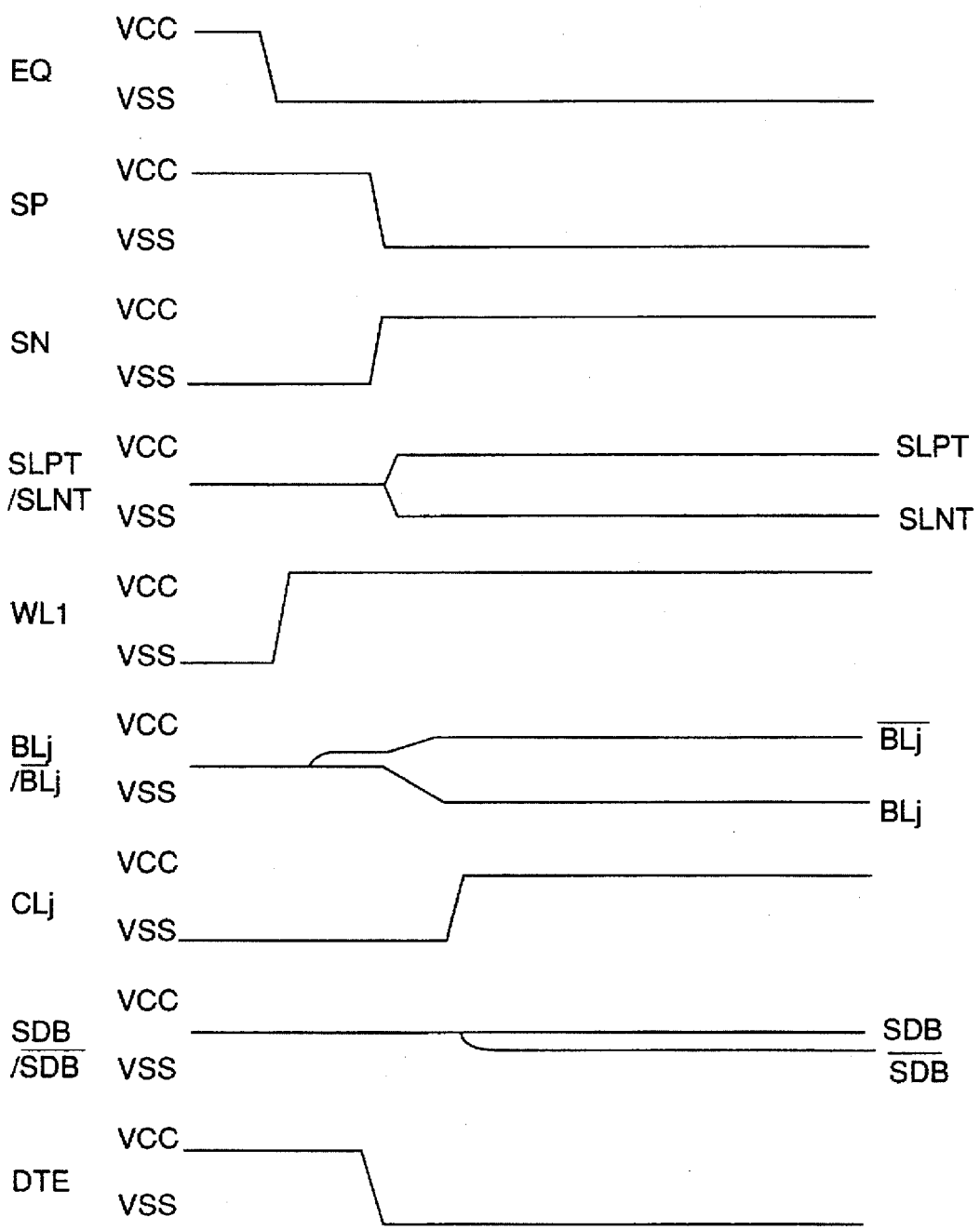
FIG. 8 is a timing chart for describing the operation of the sense amplifier array shown in FIG. 1.

A reading operation of the semiconductor memory device shown in FIGS. 1, 2 and 3 will now be described with reference to a timing chart shown in FIG. 8, for describing the operation of the sense amplifier array employed in the first embodiment of the present invention.

Prior to the reading operation, the potential of each of the column address lines $CL_0$, ~, $CL_i$ is set to the ground potential $V_{SS}$. The potential of each of the row address lines $WL_0$, ~, $WL_m$ is set to the ground potential. The potential of the sense latch circuit equalizing signal EQ is set to the power source potential $V_{CC}$. The potential of the sense latch circuit equalize terminal EQT is set to the power source potential $V_{CC}$. The potential of the P-channel sense latch enable signal SP is set to the power source potential $V_{CC}$. The potential of the P-channel sense latch enable terminal SPT is set to the power source potential $V_{CC}$. The potential of the N-channel sense latch enable signal SN is set to the ground potential $V_{SS}$. The potential of the N-channel sense latch enable terminal SNT is set to the ground potential $V_{SS}$. The transistor $MN_{11}$ is turned ON so that the potential of sense latch terminal SLPT is set to the potential of $½V_{CC}$. The transistor $MN_{12}$ is turned ON so that the potential of the sense latch terminal SLNT is set to the potential of $½V_{CC}$. The transistor $MN_4$ of the corresponding sense amplifier of the sense amplifiers $SA_0$, ~, $SA_i$ is turned ON so that the potential of each of the bit lines $BL_0$, ~, $BL_i$ is set to the potential of $½V_{CC}$. The transistor $MN_3$ of the corresponding sense amplifier of the sense amplifiers $SA_0$, ~, $SA_i$ is turned ON so that the potential of each of the bit lines $\overline{BL_0}$, ~, $\overline{BL_i}$ is set to the potential of $½V_{CC}$. The potential of the data transfer enable signal DTE is set to the power source potential $V_{CC}$. The potential of the data transfer enable terminal DTET is set to the power source potential $V_{CC}$. The data line SDB is set to a potential lowered by a threshold voltage $V_t$ of the NMOS transistor $MN_9$ from the power source potential $V_{CC}$. The data line $\overline{SDB}$ is set to a potential reduced by a threshold voltage $V_t$ of the NMOS transistor $MN_{10}$ from the power source potential $V_{CC}$. This state is called an "equalized state".

A circuit operation for reading data of "1" stored in a memory cell $MC_{j1}$ of the array $AR_m$ will now be described as an example.

An array selection signal line $AS_m$ is first selected by the decoder circuit D2. Correspondingly, the potential of the sense latch circuitequalizing signal EQ developed in the array $AR_m$ is changed to the ground potential $V_{SS}$. In doing so, the transistors $MN_3$ and $MN_4$ of each of the sense amplifiers $SA_0, \sim, SA_i$ are turned OFF so that the potential of the row address line $WL_1$ selected by the decoder circuit D3 is changed to a potential increased by a threshold voltage $V_t$ of NMOS transistor from the power source potential $V_{CC}$. With the change of the potential of the row address line $WL_1$ to the increased potential, data stored in the individual memory cells $MC_{01}, \sim, MC_{j1}, \sim, MC_{i1}$ connected to the row address line $WL_1$ are supplied to their corresponding bit lines $\overline{BL_0}, \sim, \overline{BL_j}, \sim, \overline{BL_i}$. Thus, small differences in potential are developed between the respective bit line pairs ($BL_0$ and $\overline{BL_0}$), $\sim$, ($BL_i$ and $\overline{BL_i}$). Next, the potential of the data transfer enable signal DTE is changed to the ground potential $V_{SS}$. Further, the potential of the P-channel sense latch enable signal SP is changed to the ground potential $V_{SS}$. Furthermore, the N-channel sense latch enable signal SN is changed to the $V_{CC}$ potential. Thus, the PMOS transistor $MP_3$ is turned ON so that the potential of the sense latch terminal SLPT is changed to the power source potential $V_{CC}$. Further, the NMOS transistor $MN_{13}$ is turned ON so that the potential of the sense latch terminal SLNT is changed to the ground potential $V_{SS}$. With the change of the sense latch terminals SLPT and SLNT to the power source potential $V_{CC}$ and the ground potential $V_{SS}$, the individual sense latch circuits of the sense amplifiers $SA_0, \sim, SA_i$ are driven. Thus, the difference in potential between each of the bit line pairs ($BL_0$ and $\overline{BL_0}$), $\sim$, ($BL_i$ and $\overline{BL_i}$) is amplified. As a result, the potential of the $\overline{BL_j}$ supplied with a high level potential is brought to the power source potential $V_{CC}$ and the potential of the bit line $BL_j$ is brought to the ground potential $V_{SS}$. Next, the column address line $CL_j$ is selected by the decoder circuit D1. The potential of the selected column address line $CL_j$ is changed to the power source potential $V_{CC}$. With the change of the potentials of the bit line $\overline{BL_j}$ and the column address line $CL_j$ to the power source potential $V_{CC}$, the NMOS transistors $MN_5$ and $MN_6$ of the sense amplifier $SA_j$ are turned ON. Thus, the potential of the data line $\overline{SDB}$ is reduced. With the change of the potential of the bit line $BL_j$ to the ground potential $V_{SS}$ on the other hand, the transistor $MN_7$ is turned OFF. As a result, the data line SDB is maintained at the power source potential $V_{CC}$. Thus, data corresponding to the data stored in the memory cell $MC_{j1}$ is supplied to the data line $\overline{SDB}$.

The state of each of the arrays, which have not been selected through the corresponding array selection signal lines, will now be described. The potential of a sense latch circuit equalizing signal EQ is set to the power source potential $V_{CC}$. The potential of each of the row lines $WL_0, \sim, WL_i$ is set to the ground potential $V_{SS}$. The potential of a P-channel sense latch enable signal SP is set to the power source potential $V_{CC}$. The potential of an N-channel sense latch enable signal SN is set to the ground potential $V_{SS}$. A transistor $MN_{11}$ is turned ON so that the potential of a sense latch terminal SLPT is set to a potential of $\frac{1}{2}V_{CC}$. A transistor $MN_{12}$ is turned ON so that the potential of a sense latch terminal SLNT is set to the potential of $\frac{1}{2}V_{CC}$. A transistor $MN_4$ of a corresponding sense amplifier of the sense amplifiers $SA_0, \sim, SA_i$ is turned ON so that the potential of each of the bit lines $BL_0, \sim, BL_i$ is set to the potential of $\frac{1}{2}V_{CC}$. A transistor $MN_3$ of a corresponding sense amplifier of the sense amplifiers $SA_0, \sim, SA_j$ is turned ON so that the potential of each of the bit lines $\overline{BL_0}, \sim, \overline{BL_i}$ is set to the potential of $\frac{1}{2}V_{CC}$. The potential of a data transfer enable signal DTE is set to the power source potential $V_{CC}$. A data line SDB is set to a potential reduced by a threshold voltage $V_t$ of an NMOS transistor $MN_9$ from the power source potential $V_{CC}$. A data line $\overline{SDB}$ is set to a potential reduced by a threshold voltage $V_t$ of an NMOS transistor $MN_{10}$ from the power source potential $V_{CC}$.

Even if a column address line $CL_j$ is selected in each array held in the non-selected state, an NMOS transistor $MN_5$ and an NMOS transistor $MN_7$ of a sense amplifier $SA_j$ connected to the column address line $CL_j$ are not turned ON. This is because the potential of the data transfer enable signal DTE is set to the power source potential $V_{CC}$ and the potential of the bit line pair $BL_j$ and $\overline{BL_j}$ connected to the sense amplifier $SA_j$ is set to the potential of $\frac{1}{2}V_{CC}$. Namely, each of the transistors $MN_5$ and $MN_7$ is in an OFF state. Thus, no current flows through the transistor $MN_5$. Similarly, no current flows through the transistor $MN_7$. As a result, power consumption is reduced. Here, the level of the potential of the data transfer enable signal DTE employed in the non-selected array, i.e., the potential of the data transfer enable terminal DTET may be a potential that does not allow the transistors $MN_5$ and $MN_7$ to turn ON. Namely, since the potential of the bit line pair being in the equalized state is of the $\frac{1}{2}V_{CC}$, the potential of the data transfer enable terminal DTET may be a potential higher than $\frac{1}{2}V_{CC}$ -threshold voltage $V_t$ (where $V_t$: threshold voltage of each of transistors $MN_5$ and $MN_7$).

Figure 4:
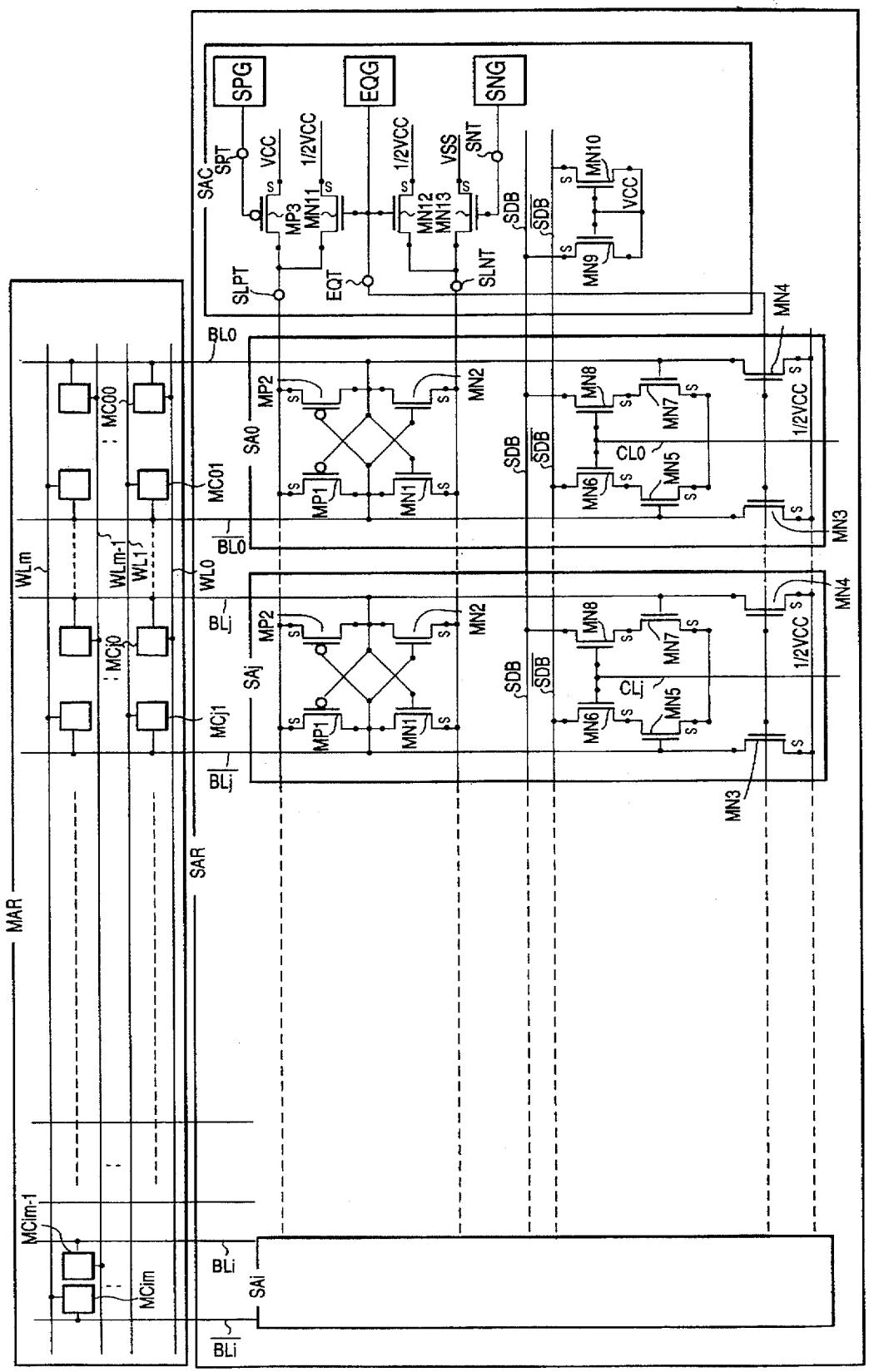
FIG. 4 is a fragmentary circuit diagram showing a sense amplifier array employed in a second embodiment of the present invention.

FIG. 4 is a fragmentary circuit diagram showing a sense amplifier array employed in a second embodiment of the present invention. The second embodiment will be described below with reference to FIG. 4. The same elements of structure as those shown in FIG. 1 or the elements of structure similar to those shown in FIG. 1 are identified by like reference numerals and their description will therefore be omitted.

In the first embodiment, the sources of the transistors $MN_5$ and $MN_7$ of each of the sense amplifiers $SA_0, \sim, SA_i$ have been connected to the data transfer enable terminal DTET through the data transfer enable line DTEA. In the second embodiment to the contrary, the sources of transistors $MN_5$ and $MN_7$ of each of sense amplifiers $SA_0, \sim, SA_i$ are electrically connected to a sense latch terminal SLNT. No generating circuit DTEG is provided in the second embodiment.

A reading operation of the second embodiment will now be described. In a selected array, the potential of a sense latch terminal SLNT is reduced in a manner similar to the data transfer enable terminal DTET employed in the first embodiment. Thus, each output circuit is activated in the same manner as that employed in the first embodiment. In non-selected each array, the potential of a sense latch terminal SLNT is set to a potential of $\frac{1}{2}V_{CC}$. Thus, the potentials of the sources of the transistors $MN_5$ and $MN_7$ of each of the sense amplifiers $SA_0, \sim, SA_j$ are respectively set to the potential of $\frac{1}{2}V_{CC}$. Further, the potential of each of bit lines $BL_0, \sim, BL_j, \overline{BL_j}, \sim, \overline{BL_i}$ is set to the potential of $\frac{1}{2}V_{CC}$. Therefore, the transistors $MN_5$ and $MN_7$ of each of the sense amplifiers $SA_0, \sim, SA_i$ are brought into an OFF state. Thus, even if a column address line $CL_j$ is selected, no current flows through the transistor $MN_5$ of the sense amplifier $SA_j$.

Further, no current flows through the transistor $MN_7$ of the sense amplifier $SA_j$. Since the sources of the transistors $MN_5$ and $MN_7$ of each of the sense amplifiers $SA_0$, ~, $SA_i$ are electrically connected to the sense latch terminal SLNT, the generating circuit DTEG becomes unnecessary in the second embodiment. Accordingly, the second embodiment can bring about advantageous effects that logic and layout designs become easy as well as advantageous effects obtained in the first embodiment.

Figure 5:
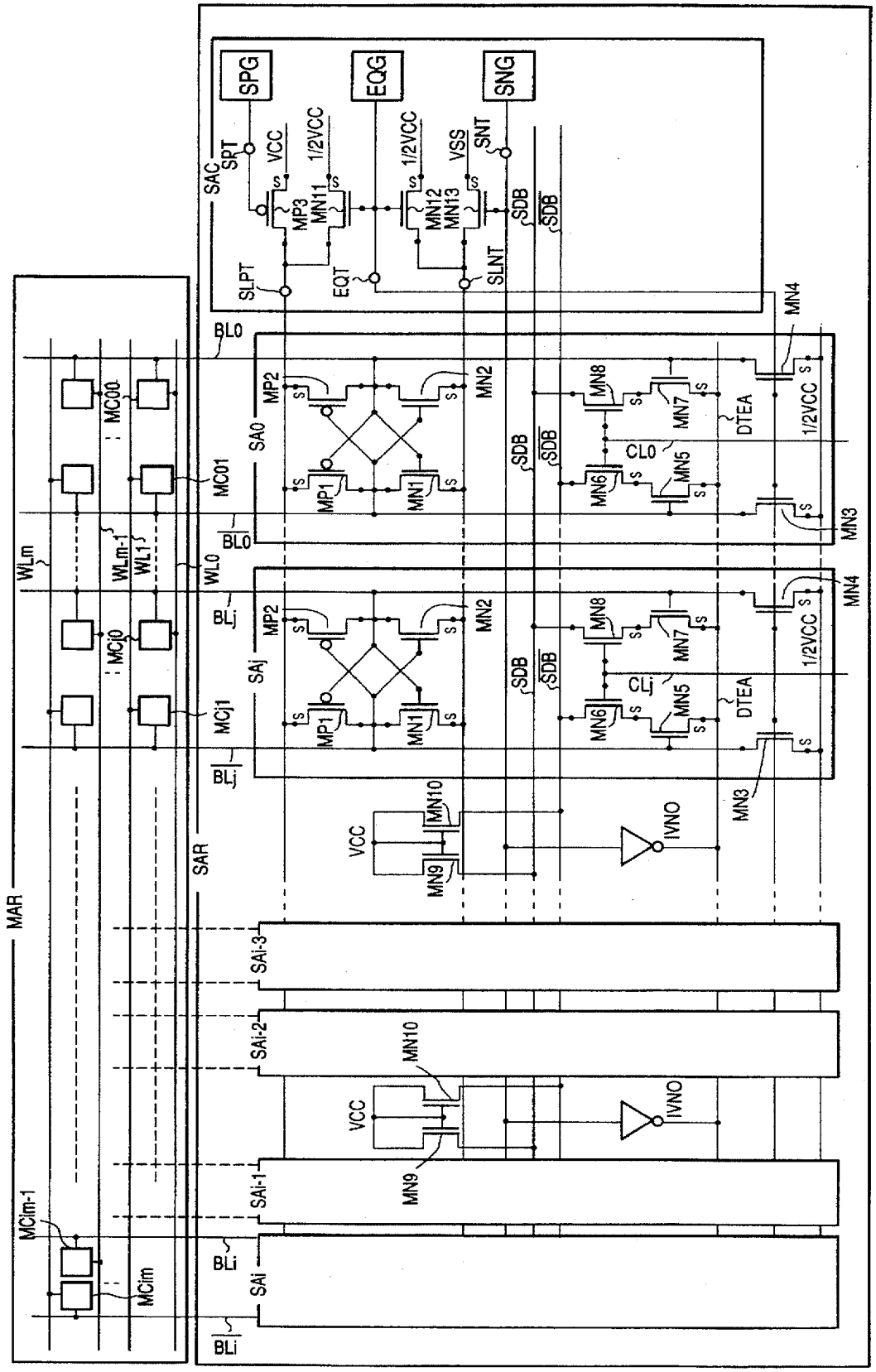
FIG. 5 is a fragmentary circuit diagram illustrating a sense amplifier array employed in a third embodiment of the present invention.

FIG. 5 is a fragmentary circuit diagram showing a sense amplifier array employed in a third embodiment of the present invention. The third embodiment will be described below with reference to FIG. 5. The same elements of structure as those shown in FIG. 1 or the elements of structure similar to those shown in FIG. 1 are identified by like reference numerals and their description will therefore be omitted.

A generating circuit DTEG is not provided in the third embodiment. An inverter INV0 and a pair of NMOS transistors $MN_9$ and $MN_{10}$ are provided at plural places within a sense amplifier array SAR. The placement and connections of the inverters INV0 and the NMOS transistors $MN_9$ and $MN_{10}$ will now be described in detail.

The inverters INV0 are disposed in the neighborhood of their corresponding sense amplifier groups of sense amplifier groups each comprised of an appropriate number of sense amplifiers. The output of each inverter INV0 is electrically connected to a data transfer enable line DTEA provided in the vicinity of its corresponding sense amplifier group. The input of each inverter INV0 is electrically connected to an N-channel sense latch enable terminal SNT. The NMOS transistors $MN_{10}$ are provided in the neighborhood of their corresponding sense amplifier groups of the sense amplifier groups. One ends of the individual NMOS transistors $MN_{10}$ are electrically connected to their corresponding data lines $\overline{SDB}$ provided in the neighborhood of the corresponding sense amplifier groups. The NMOS transistors $MN_9$ are provided in the neighborhood of their corresponding sense amplifier groups of the sense amplifier groups. One end of each NMOS transistor $MN_9$ is electrically connected to its corresponding data line SDB in the vicinity of the corresponding sense amplifier group.

In the third embodiment, a signal obtained by inverting an N-channel sense latch enable signal SN is supplied to the data transfer enable line DTEA through the plurality of inverters INV0. Thus, each output circuit performs an output operation substantially similar to the first embodiment.

Comparisons will now be made between advantageous effects brought about by the third embodiment and those obtained in the first embodiment.

In the semiconductor memory device according to the first embodiment, the number of the sense amplifiers $SA_0$ through $SA_i$ is regarded as being provided in plural form. In the first embodiment, junction points between the sense amplifier $SA_0$ and the data lines are provided close to junction point between the NMOS transistors $MN_9$ and the data lines SDB and junction point between NMOS transistors $MN_{10}$ and the data lines $\overline{SDB}$ than junction points between the sense amplifier $SA_i$ and the data lines SDB and $\overline{SDB}$.

Thus, if a comparison is made between the case where the NMOS transistors $MN_5$ and $MN_6$ of the sense amplifier $SA_0$ are turned ON and the potential of the data line $\overline{SDB}$ is reduced, for example, and the case where the NMOS transistors $MN_5$ and $MN_6$ of the sense amplifier $SA_i$ are turned ON and the potential of the data line $\overline{SDB}$ is reduced, then the latter makes a path over which the current flows along the data line $\overline{SDB}$ longer. Wiring resistances are included in the data lines. Thus, when the sense amplifier $SA_i$ is driven and the potential of the data line $\overline{SDB}$ is reduced, the potential of a portion near the junction point at which the sense amplifier $SA_i$ is connected to the data line $\overline{SDB}$ is greatly reduced as compared with the case where the sense amplifier $SA_0$ is driven and the potential of the data line $\overline{SDB}$ is lowered.

In the third embodiment on the other hand, the transistors $MN_9$ and $MN_{10}$ are disposed at plural places within the sense amplifier array SAR. Thus, if a comparison is made between the case where a sense amplifier $SA_i$ is driven and the potential of a data line is reduced in the third embodiment, for example, and the case where the sense amplifier $SA_i$ is driven and the potential of the data line is reduced in the first embodiment, then the former can bring about a less reduction in the potential of the neighboring data line connected to the sense amplifier $SA_i$. Thus, since the potential on the data line is not greatly reduced in the third embodiment, the semiconductor memory device can be activated at high speed upon reading the next data.

In the first embodiment, the data transfer enable line DTEA is electrically connected to the data transfer enable terminal DTET supplied with the data transfer enable signal DTE. The sense amplifier $SA_0$ is electrically connected to the data transfer enable line DTEA at junction points relatively near the data transfer enable terminal DTET. Further, the sense amplifier $SA_i$ is electrically connected to the data transfer enable line DTEA at junction points spaced away from the data transfer enable terminal DTET. Therefore, if a comparison is made between the case where the transistors $MN_5$ and $MN_6$ of the sense amplifier $SA_0$ disposed relatively close to the data transfer enable terminal DTET are turned ON and the potential of the data line $\overline{SDB}$ is reduced and the case where the transistors $MN_5$ and $MN_6$ of the sense amplifier $SA_i$ disposed away from the data transfer enable terminal DTET are turned ON and the potential of the data line $\overline{SDB}$ is reduced, then the latter makes longer a path over which the current flows along the data transfer enable line DTEA. Since wiring resistances are included in the data transfer enable line DTEA here, the potential of the source of the transistor $MN_5$ in the sense amplifier $SA_i$ is raised when the sense amplifier $SA_i$ is driven and the data line $\overline{SDB}$ is reduced in potential. Therefore, the transistor $MN_5$ is hard to turn ON and the operation of reducing the potential on the data line $\overline{SDB}$ becomes slow.

Since the inverters are located in the plural places of the sense amplifier array so as to correspond to the appropriate number of sense amplifier groups in the third embodiment, a path over which the current flows along the data transfer enable line DTEA, is shortened when the potential of the data line SDB or $\overline{SDB}$ is lowered. Thus, the potentials of the sources of NMOS transistors $MN_5$ and $MN_7$ are respectively reduced to a potential enough to turn ON the NMOS transistors $MN_5$ and $MN_7$. As a result, the potential on each data line can be lowered at high speed. Further, since each inverter INV0 is electrically connected between the data transfer enable line DTEA and the N-channel sense latch enable terminal SNT, it is unnecessary to provide a generating circuit DTEG. Therefore, logic and layout designs can be easily carried out.

Figure 6:
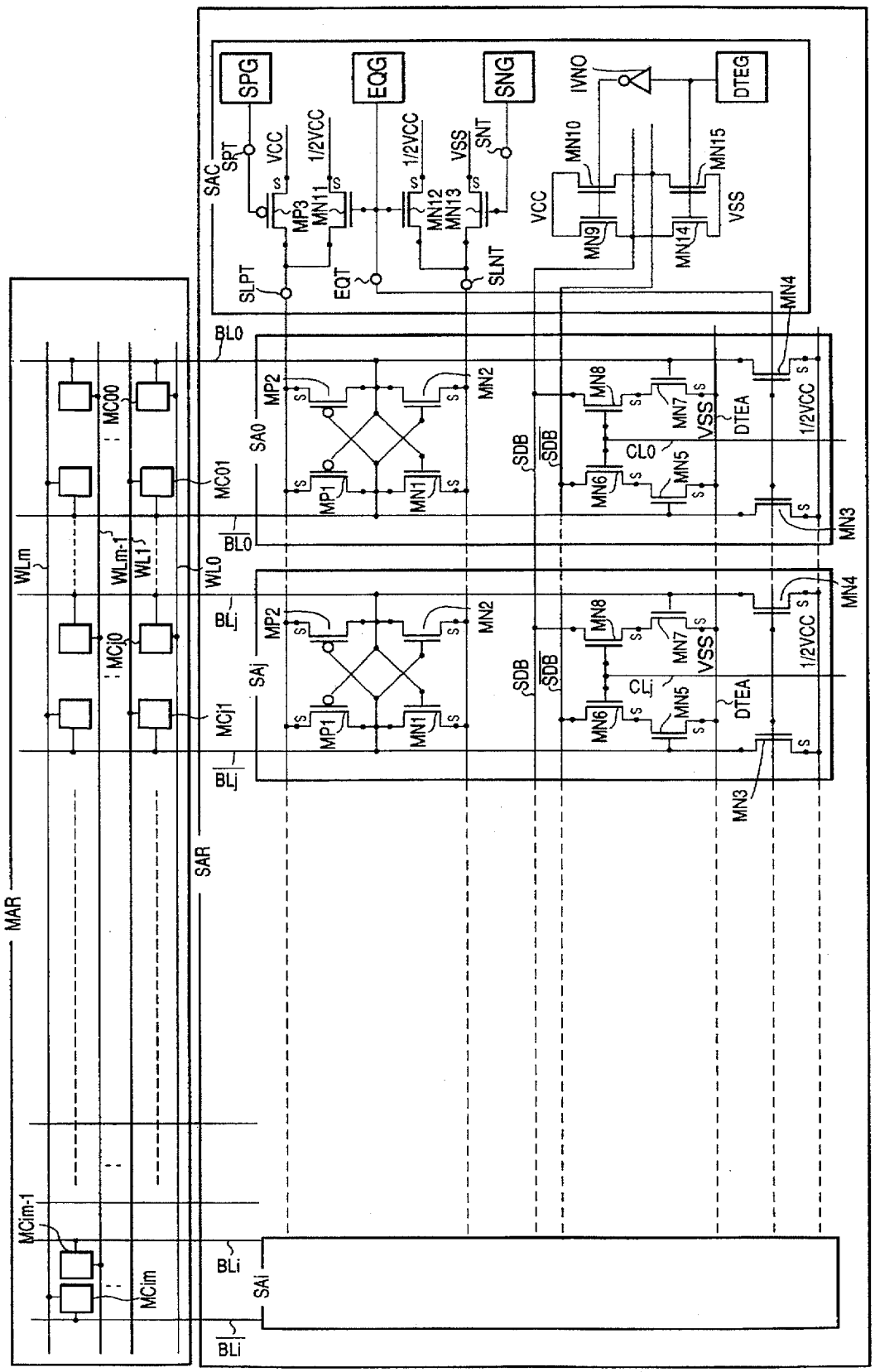
FIG. 6 is a fragmentary circuit diagram depicting a sense amplifier array employed in a fourth embodiment of the present invention.

FIG. 6 is a fragmentary circuit diagram showing a sense amplifier array employed in a fourth embodiment of the present invention. The fourth embodiment will be described below with reference to FIG. 6. The same elements of structure as those shown in FIG. 1 or the elements of structure similar to those shown in FIG. 1 are identified by like reference numerals and their description will therefore be omitted.

Referring to FIG. 6, the drain of a data line pull-down transistor $MN_{14}$ is electrically connected to a data line $\overline{SDB}$ and the source thereof is supplied with a ground potential $V_{SS}$. The gate of the transistor $MN_{14}$ is supplied with a data transfer enable signal DTE. The drain of a data line pull-down transistor $MN_{15}$ is electrically connected to a data line $\overline{SDB}$ and the source thereof is supplied with the ground potential $V_{SS}$. The gate of the transistor $MN_{15}$ is supplied with the data transfer enable signal DTE. In the first embodiment, the gates of the transistors $MN_9$ and $MN_{10}$ are supplied with the power source potential $V_{CC}$. In the fourth embodiment, however, the gates of transistors $MN_9$ and $MN_{10}$ are electrically connected to an output terminal of an inverter INV0. Further, an input terminal of the inverter INV0 is electrically connected to a generating circuit DTEG and is supplied with the data transfer enable signal DTE. Further, a data transfer enable line DTEA is electrically connected to the ground potential $V_{SS}$.

Figure 9:
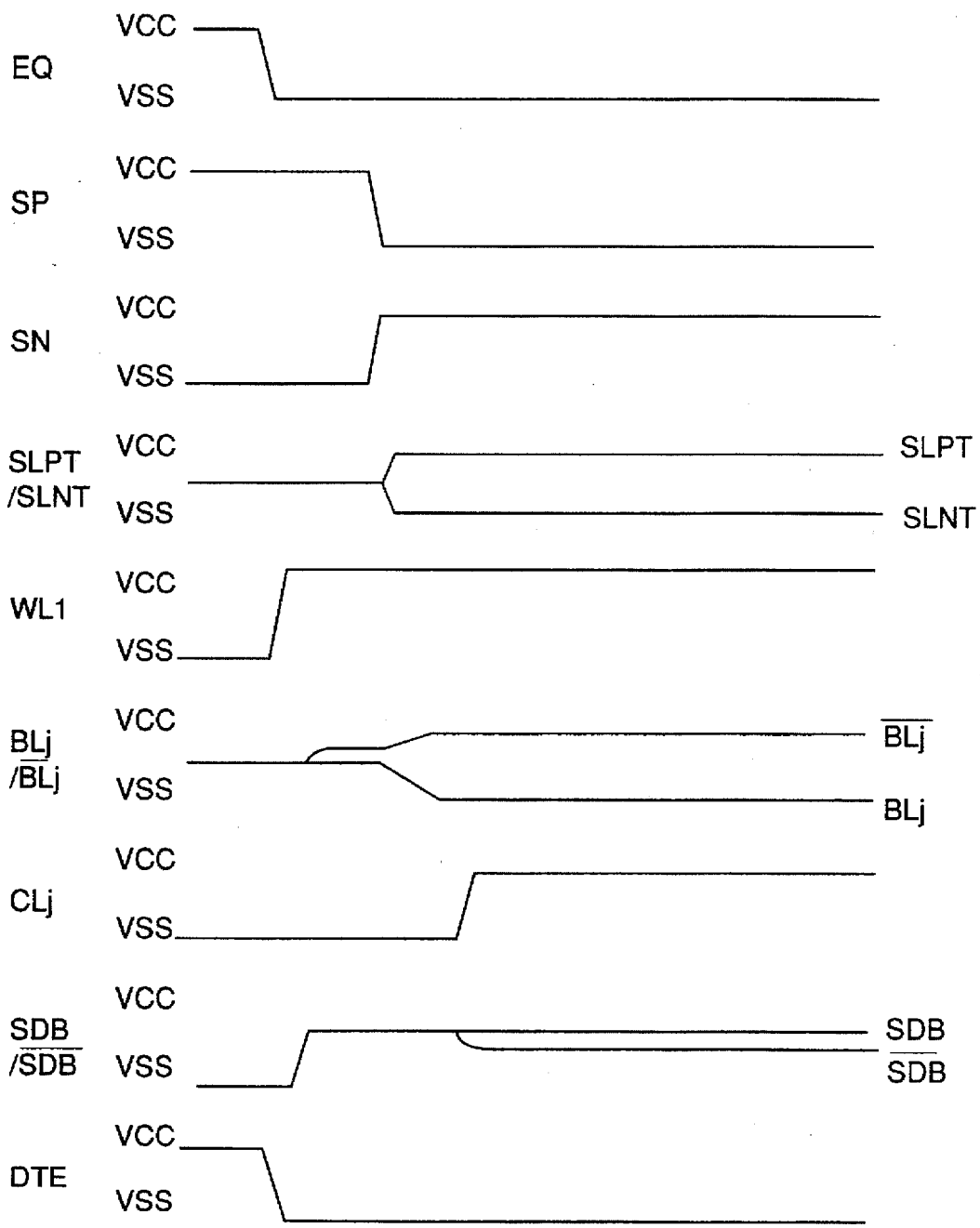
FIG. 9 is a timing chart for describing the operation of the sense amplifier array shown in FIG. 6.

A reading operation of the sense amplifier array employed in the fourth embodiment of the present invention will now be described with reference to a timing chart shown in FIG. 9.

Prior to the reading operation, the potential of each of column address lines $CL_0$, ~, $CL_i$ is set to the ground potential $V_{SS}$. The potential of a sense latch circuit equalizing signal EQ is set to the power source potential $V_{CC}$ and the potential of a sense latch circuit equalize terminal EQT is set to the power source potential $V_{CC}$. The potential of a P-channel sense latch enable signal SP is se to the power source potential $V_{CC}$ and the potential of a P-channel sense latch enable terminal SPT is set to the power source potential $V_{CC}$. The potential of an N-channel sense latch enable signal SN is set to the ground potential $V_{SS}$ and the potential of an N-channel sense latch enable terminal SNT is set to the ground potential $V_{SS}$. NMOS transistors $MN_{11}$ and $MN_{12}$ are turned ON so that the potentials of the sense latch terminals SLPT and SLNT are respectively set to a potential of ½$V_{CC}$. A transistor $MN_4$ of each of sense amplifiers $SA_0$ through $SA_i$ is turned ON so that the potential of each of bit lines $BL_0$ through $BL_i$ is set to the potential of ½$V_{CC}$. A transistor $MN_3$ of each of sense amplifiers $SA_0$ through $SA_j$ is turned ON so that the potential of each of bit lines $\overline{BL_0}$ through $\overline{BL_i}$ is set to the potential of ½$V_{CC}$. The potential of the data transfer enable signal DTE is set to the power source potential $V_{CC}$. Thus, the potentials of the data lines SDB and $\overline{SDB}$ are set to the ground potential $V_{SS}$. This state is called an "equalized state".

A circuit operation for reading data of "1" stored in a memory cell $MC_{j1}$ of an array $AR_m$ will now be described.

The circuit operation of the selected array $AR_m$ will be described below.

When an array selection signal line $AS_m$ is first selected by a decoder circuit D2, the potential of the sense latch circuit equalizing signal EQ developed in the array $AR_m$ is changed to the ground potential $V_{SS}$. Further, the potential of a row address line $WL_1$ selected by a decoder circuit D3 is changed to a potential increased by a threshold voltage $V_t$ of each NMOS transistor from the power source potential $V_{CC}$. With the change of the potential of the data transfer enable signal DTE to the ground potential $V_{SS}$, the data line pull-down NMOS transistors $MN_{14}$ and $MN_{15}$ are turned OFF and the data line pull-up transistors $MN_9$ and $MN_{10}$ are turned ON to thereby change the potential of the data line pair SDB and $\overline{SDB}$ to a potential reduced by a threshold voltage $V_t$ of each NMOS transistor from the power source potential $V_{CC}$. With the transition from the present potential of the row address line $WL_1$ to the increased potential, data stored in individual memory cells $MC_{01}$, ~, $MC_{j1}$, ~, $MC_{i1}$ connected to the row address line $WL_1$ are supplied to their corresponding bit lines $\overline{BL_0}$, ~, $\overline{BL_j}$, ~, $\overline{BL_i}$. Thus, small differences in potential are developed between the respective bit line pairs ($BL_0$ and $\overline{BL_0}$), ~, ($BL_j$ and $\overline{BL_j}$), ~, ($BL_i$ and $\overline{BL_i}$). Next, the potential of the P-channel sense latch enable signal SP is changed to the ground potential $V_{SS}$. Further, the potential of the N-channel sense latch enable signal SN is changed to the ground potential $V_{CC}$. Thus, a PMOS transistor $MP_3$ is turned ON and the potential of the sense latch terminal SLPT is changed to the power source potential $V_{CC}$. Further, an NMOS transistor $MN_{13}$ is turned ON so that the potential of the sense latch terminal SLNT is changed to the ground potential $V_{SS}$. The sense latch terminals SLPT and SLNT are respectively changed to the power source potential $V_{CC}$ and the ground potential $V_{SS}$ so that individual sense latch circuits of the sense amplifiers $SA_0$, ~, $SA_j$, ~, $SA_i$ are driven. As a result, the difference in potential between each of the bit line pairs ($BL_0$ and $\overline{BL_0}$), ~, ($BL_j$ and $\overline{BL_j}$), ~, ($BL_i$ and $\overline{BL_i}$) is amplified.

Thus, the potential of the bit line $\overline{BL_j}$ supplied with the data of "1" is brought to the power source potential $V_{CC}$ and the potential of the bit line $BL_j$ is brought to the ground potential $V_{SS}$. When a column address line $CL_j$ is next selected by a decoder circuit D1, the potential of the selected column address line $CL_j$ is changed to the power source potential $V_{CC}$. With the transition from the present potentials of the bit line $\overline{BL_j}$ and the column address line $CL_j$ to the power source potential $V_{CC}$, NMOS transistors $MN_5$ and $MN_6$ of the sense amplifier $SA_j$ are turned ON and hence the potential of the data line $\overline{SDB}$ is reduced to the ground potential $V_{SS}$. On the other hand, since the potential of the bit line $BL_j$ is changed to the ground potential $V_{SS}$, the corresponding transistor $MN_7$ is turned OFF. As a result, the potential of the data line SDB remains unchanged. Thus, data corresponding to the data stored in the memory cell $MC_{j1}$ is supplied to the data line $\overline{SDB}$.

The state of each of the arrays, which are not selected through the corresponding array selection signal lines, will now be described. The potential of a sense latch circuit equalizing signal EQ is set to the power source potential $V_{CC}$ level. The potential of a P-channel sense latch enable signal SP is set to the power potential $V_{CC}$. The potential of an N-channel sense latch enable signal SN is set to the ground potential $V_{SS}$. Transistors $MN_{11}$ and $MN_{12}$ are turned ON so that the potentials of sense latch terminals SLPT and SLNT are respectively set to a potential of ½$V_{CC}$. A transistor $MN_4$ of a corresponding sense amplifier of sense amplifiers $SA_0$, ~, $SA_i$ is turned ON so that the potential of each of bit lines $BL_0$, ~, $BL_i$ is set to the potential of ½$V_{CC}$. A transistor $MN_3$ of a corresponding sense amplifier of the sense amplifiers $SA_0$, ~, $SA_i$ is turned ON so that the potential of each of bit lines $\overline{BL_0}$, ~, $\overline{BL_i}$ is set to the potential of ½$V_{CC}$. The potential of a data transfer enable signal DTE is set to the power source potential $V_{CC}$. The potential of a data line SDB is set to the ground potential $V_{SS}$. The potential of a data line $\overline{SDB}$ is set to the ground potential $V_{SS}$. The potential of each of row address lines $WL_0$ through $WL_i$ is set to the ground potential $V_{SS}$. The potential of a data transfer enable line DTEA is set to the ground potential $V_{SS}$.

Now, consider that a column address line $CL_j$ is selected and transistors $MN_6$ and $MN_8$ of a sense amplifier $SA_j$ are turned ON in this condition. Since the data lines SDB and $\overline{SDB}$ and the data transfer enable line DTEA are maintained at the ground potential $V_{SS}$, no current flows between the NMOS transistors $MN_5$ and $MN_6$ of the sense amplifier $SA_j$. Further, the current does not flow between the NMOS transistors $MN_7$ and $MN_8$ of the sense amplifier $SA_j$.

In the fourth embodiment, the data can be supplied to the data line pair at high speed as compared with the first embodiment. The reason will be described as follows:

In the first embodiment, the potential of each of the bit lines $BL_0$, ~, $\overline{BL_i}$ is set substantially to the potential of $\frac{1}{2}V_{CC}$ when the potential of the data transfer enable signal DTE is changed to the ground potential $V_{SS}$. Thus, when the potential of the data transfer enable line DTEA is reduced by $V_t$ from the potential of $\frac{1}{2}V_{CC}$, the transistors $MN_5$ and $MN_7$ of each of the sense amplifiers $SA_0$ through $SA_i$ are turned ON. Therefore, capacitances between the source and gates of the transistors $MN_5$ and $MN_7$ of each of the sense amplifiers $SA_0$ through $SA_i$ are added to the data transfer enable line DTEA.

Let's now consider where the gate of the transistor $MN_6$ of each of the sense amplifiers $SA_0$, ~, $SA_i$ is electrically connected to its corresponding bit line of the bit lines $\overline{BL_0}$, ~, $\overline{BL_i}$, the gate of the transistor $MN_8$ of each of the sense amplifiers $SA_0$, ~, $SA_i$ is electrically connected to its corresponding bit line of the bit lines $BL_0$, ~, $BL_i$, the transistor $MN_5$ of each of the sense amplifiers $SA_0$, ~, $SA_i$ is electrically connected to its corresponding column address line of the column address lines $CL_0$, ~, $CL_i$, and the transistor $MN_7$ of each of the sense amplifiers $SA_0$, ~, $SA_i$ is electrically connected to its corresponding column address line of the column address lines $CL_0$, ~, $CL_i$.

When the potential of the $\overline{SDB}$ is lowered, the potential of one bit line of each of the bit line pairs ($BL_0$ and $\overline{BL_0}$), ~, ($BL_i$ and $\overline{BL_i}$) is brought to the power source potential $V_{CC}$. Therefore, either one of the transistors $MN_6$ and $MN_8$ of each of the sense amplifiers $SA_0$, ~, $SA_i$ is turned ON. As a result, a capacitance is added to the data line $\overline{SDB}$.

In the fourth embodiment to the contrary, the potentials of the sources of the transistors $MN_5$ and $MN_7$ of each of the sense amplifiers $SA_0$, ~, $SA_i$ are fixed to the ground potential $V_{SS}$. The gates of the transistors $MN_6$ and $MN_8$ of each of the sense amplifiers $SA_0$, ~, $SA_i$ are electrically connected to their corresponding column address line of the column address lines $CL_0$, ~, $CL_i$. Since the potential of each of the column address lines $CL_0$, ~, $CL_i$ is of the ground potential $V_{SS}$ when the potential of the data line $\overline{SDB}$ or $\overline{SDB}$ is changed to the potential reduced by $V_t$ from the power source potential $V_{CC}$, the transistors $MN_6$ and $MN_8$ of each of the sense amplifiers $SA_0$, ~, $SA_i$ are not turned ON. Thus, no capacitance is added to the data line SDB or \X\TO(SDB) at this time. Further, when the potential of the data line $\overline{SDB}$ is lowered, the potential of each column address line other than the column address line $CL_j$ is set to the ground potential $V_{SS}$. Thus, since the transistors $MN_6$ and $MN_8$ of each of the sense amplifiers $SA_0$, ~, $SA_i$ other than the sense amplifier $SA_j$ are turned OFF, the capacitances of these transistors are not added to the data line $\overline{SDB}$. As a result, the potential of the data line $\overline{SDB}$ is rapidly reduced.

Figure 7:
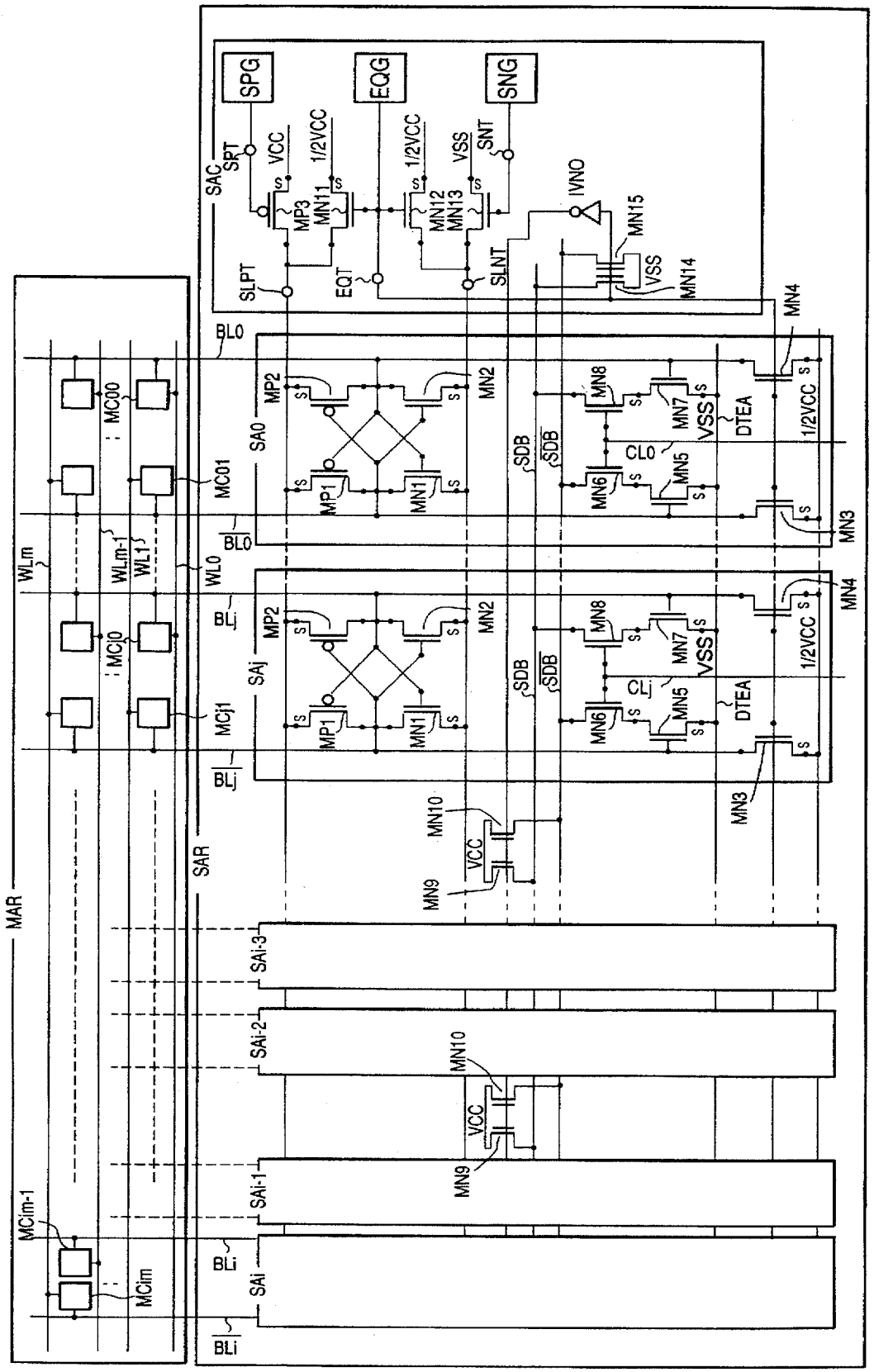
FIG. 7 is a fragmentary circuit diagram showing a sense amplifier array employed in a fifth embodiment of the present invention.

FIG. 7 is a fragmentary circuit diagram showing a sense amplifier array employed in a fifth embodiment of the present invention. The fifth embodiment will be described below with reference to FIG. 7. The same elements of structure as those shown in FIG. 6 or the elements of structure similar to those shown in FIG. 6 are identified by like reference numerals and their description will therefore be omitted.

In the fifth embodiment, bit line pull-up transistors $MN_9$ and $MN_{10}$ are disposed at plural places within a sense amplifier array so as to correspond to an appropriate number of sense amplifier groups. Thus, when the potential of a data line SDB or $\overline{SDB}$ is lowered, a path over which the current flows along the data line, is shortened. The resistance is reduced by the shortened path. As a result, the potential of the data line SDB or $\overline{SDB}$ is not reduced to a potential than required. The semiconductor memory device according to the fifth embodiment can bring about an advantageous effect that it can be activated at high speed, as well as that obtained in the fourth embodiment.

In the first through fifth embodiments, the sense amplifier control circuit SAC is provided on the sense amplifier $SA_0$ side so that the sense amplifier $SA_0$ be opposed to the sense amplifier $SA_i$. However, the sense amplifier control circuit SAC may be provided on the sense amplifier $SA_i$ side.

In the first, second and third embodiments, the gates of the NMOS transistors $MN_6$ of the sense amplifiers $SA_0$, ~, $SA_i$ may be connected to their corresponding bit lines $\overline{BL_0}$, ~, $\overline{BL_i}$. Further, the gates of the NMOS transistors $MN_8$ of the sense amplifiers $SA_0$, ~, $SA_i$ may be connected to their corresponding bit lines $BL_0$, ~$BL_i$. Furthermore, the gates of the NMOS transistors $MN_5$ and $MN_7$ of the sense amplifiers $SA_0$, ~, $SA_i$ may be connected to their corresponding column address lines $CL_0$, ~, $CL_i$.

In the second embodiment, the sources of the NMOS transistors $MN_5$ and $MN_7$ of the sense amplifiers $SA_0$, ~, $SA_i$ are electrically connected to their corresponding sense latch terminal SLNT. However, the sources of the NMOS transistors $MN_5$ and $MN_7$ may be connected to the P-channel sense latch enable terminal SPT or the sense latch circuit equalize terminal EQT.

In the fourth and fifth embodiments, the drains of the NMOS transistors $MN_9$ are respectively supplied with the power source potential $V_{CC}$. The gates of the NMOS transistors $MN_9$ are electrically connected to the power source potential Vcc and the sources thereof are electrically connected to their corresponding data line SDB. Further, the drains of the NMOS transistors $MN_{10}$ are respectively supplied with the power source potential $V_{CC}$. The gates of the NMOS transistors $MN_{10}$ are electrically connected to source potential and the source thereof are electrically connected to their corresponding data line $\overline{SDB}$. However, the gates of the NMOS transistors $MN_9$ and the gates of the NMOS transistors $MN_{10}$ may be connected to the power source $V_{CC}$. Further, the sources of the NMOS transistors $MN_9$ and the drains of the NMOS transistors $MN_{10}$ may be connected to the N-channel sense latch enable terminal SNT.

Although the input of the inverter INV0 has been connected to the sense latch circuit equalize terminal EQT in the fifth embodiment, the input thereof may be connected to the P-channel sense latch enable terminal SPT.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor memory device comprising:
    a plurality of arrays, each array including:
        a row address line;

a memory cell connected to the row address line;

a bit line responsive to data stored in said memory cell when said row address line is selected;

a data line;

a column address line being supplied with a column address signal;

a node;

an output circuit connected to the data line, said node, said column address line and said bit line, said output circuit having a first state for setting said data line to a potential corresponding to a potential of said bit line and a second state for not passing an electric current therethrough between said node and said data line;

said plurality of arrays having the column address lines mutually connected to one another; and a decoder connected to the plurality of arrays, for selecting some of said plurality of arrays or any one of said plurality of arrays;

wherein said output circuit in an array selected by said decoder is set to the first state in response to said column address signal, and said output circuit in an array non-selected by said decoder is maintained in said second state irrespective of said column address signal.

2. A semiconductor memory device as set forth in claim 1, wherein each of said plurality of arrays includes a node potential setting circuit, said node potential setting circuit supplying one of a first potential and a second potential to the node, and the node in each non-selected array being set to each first potential and the node in the selected array being set to said second potential.

3. A semiconductor memory device as set forth in claim 1, wherein each of said plurality of arrays includes a data line potential setting circuit, said data line potential setting circuit supplying a first potential or a second potential to said data line, and said data line potential setting circuit supplies said first potential to said data line in an array selected by said decoder, and said data line potential setting circuit supplies said second potential to said data line in an array non-selected by said decoder.

* * * * *